United States Patent
Sayles et al.

(10) Patent No.: US 12,284,776 B2
(45) Date of Patent: Apr. 22, 2025

(54) TRANSPORT SYSTEM FOR ELECTRONIC EQUIPMENT RACKS

(71) Applicant: Dell Products L.P., Round Rock, TX (US)

(72) Inventors: Jeffery Todd Sayles, San Marcos, CA (US); James Don Curlee, Round Rock, TX (US); Tony P. Middleton, Cedar Park, TX (US); Luis Alejandro Ruiz Holguin, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 850 days.

(21) Appl. No.: 17/507,064

(22) Filed: Oct. 21, 2021

(65) Prior Publication Data
US 2023/0128067 A1  Apr. 27, 2023

(51) Int. Cl.
*H05K 7/14* (2006.01)

(52) U.S. Cl.
CPC ......... *H05K 7/1488* (2013.01); *H05K 7/1498* (2013.01)

(58) Field of Classification Search
CPC .... H05K 7/1488; H05K 7/1498; B65D 19/08; B65D 19/10; B65D 19/385; B65D 2585/6837; B65D 2585/86; B65D 2519/00741
See application file for complete search history.

(56) References Cited

U.S. PATENT DOCUMENTS

| | | | | |
|---|---|---|---|---|
| 2,369,944 A | * | 2/1945 | Cahners | B65D 19/0069 108/57.1 |
| 2,372,055 A | * | 3/1945 | Braun | B65D 19/0018 108/57.34 |
| 2,444,183 A | * | 6/1948 | Cahners | B65D 19/0016 280/19 |
| 2,479,728 A | * | 8/1949 | Darling | B65D 19/0012 108/57.1 |
| 2,503,240 A | * | 4/1950 | Cahners | B65D 19/0028 108/51.3 |
| 6,657,123 B2 | * | 12/2003 | Moore | H02B 1/32 361/679.01 |
| 8,985,350 B2 | * | 3/2015 | Thrush | A47B 96/025 211/175 |
| 10,863,646 B1 | * | 12/2020 | Rampey | A47B 61/02 |

(Continued)

FOREIGN PATENT DOCUMENTS

FR   3028840 A1 * 5/2016 .............. H05K 7/14
JP   2000225949 A * 8/2000

*Primary Examiner* — Hilary L Gutman
(74) *Attorney, Agent, or Firm* — Ryan, Mason & Lewis, LLP

(57) ABSTRACT

A transport support structure comprises a platform, a first frame side on the platform, a second frame side on the platform and a third frame side on the platform. The second frame side is disposed opposite and spaced apart from the first frame side, and the third frame side extends between the first and second frame sides. The transport support structure further comprises first and second support receiving members disposed under the platform. The first support receiving member includes a first opening configured to receive a first lifting device support element, and the second support receiving member includes a second opening configured to receive a second lifting device support element.

20 Claims, 12 Drawing Sheets

(56) References Cited

U.S. PATENT DOCUMENTS

| | | | |
|---|---|---|---|
| 11,229,139 B2* | 1/2022 | Bailey | H05K 7/1495 |
| 11,533,821 B2* | 12/2022 | Bailey | H05K 7/1497 |
| 2015/0076976 A1* | 3/2015 | Bailey | H05K 7/1491 |
| | | | 312/223.1 |
| 2016/0052671 A1* | 2/2016 | McCurry | B65D 85/66 |
| | | | 108/55.3 |
| 2016/0121915 A1* | 5/2016 | Mkandawire | B62B 3/02 |
| | | | 414/277 |
| 2018/0340368 A1* | 11/2018 | Zwierzykowski | E06B 9/0653 |
| 2021/0153375 A1* | 5/2021 | Bailey | H05K 7/1497 |

* cited by examiner

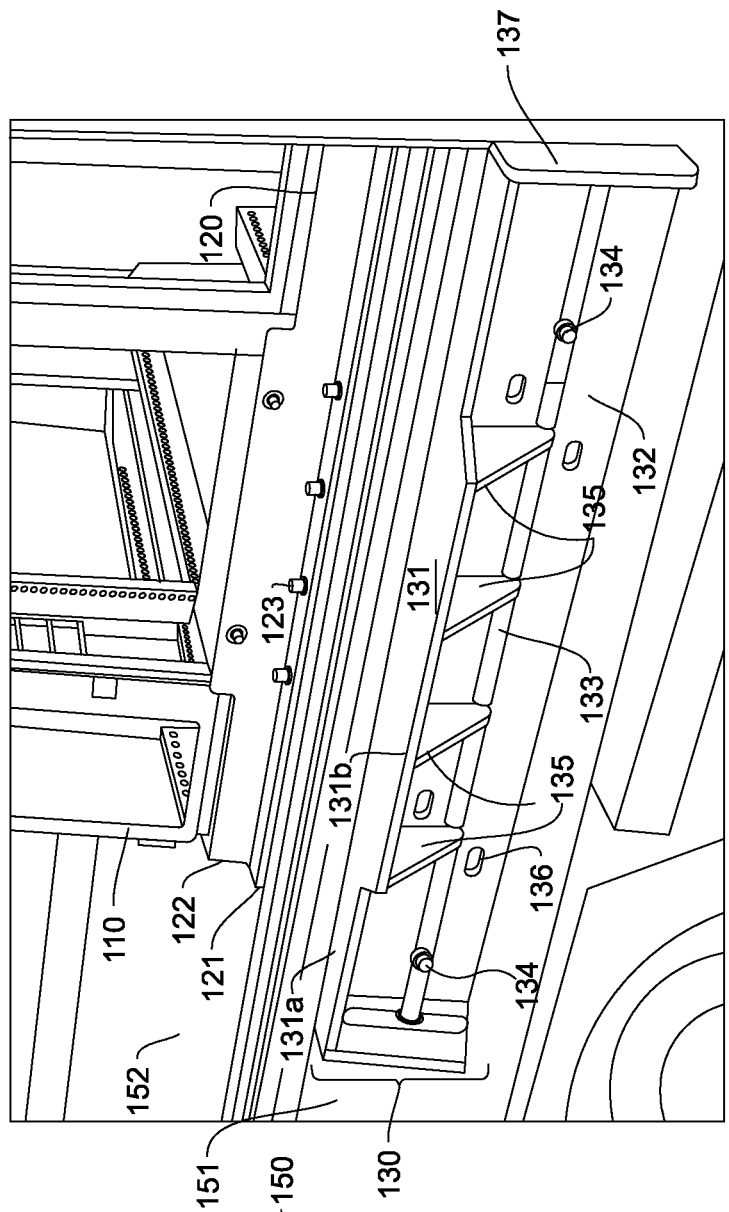
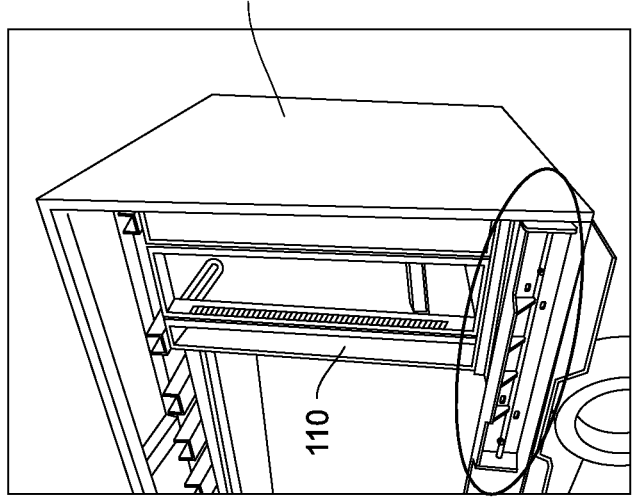
FIG. 2A
FIG. 2B

TRANSPORT SYSTEM FOR ELECTRONIC EQUIPMENT RACKS

FIELD

The field relates generally to electronic equipment, and more particularly to a transport system for electronic equipment racks.

BACKGROUND

In certain situations, electronic equipment racks need to be loaded onto elevated floors for placement in a modular datacenter. Additionally, in the event that the electronic equipment racks are shipped from, for example, manufacturers or vendors to consumers, the equipment racks need to be loaded and unloaded to and from transport vehicles, such as truck trailers or trains. In many cases, the equipment racks are not be structurally sound enough to be transferred to different elevations with lifting devices such as, for example, forklifts, and may be damaged during loading and unloading processes.

SUMMARY

Illustrative embodiments provide transport solutions for electronic equipment.

In one embodiment, a transport support structure comprises a platform, a first frame side on the platform, a second frame side on the platform and a third frame side on the platform. The second frame side is disposed opposite and spaced apart from the first frame side, and the third frame side extends between the first and second frame sides. The transport support structure further comprises first and second support receiving members disposed under the platform. The first support receiving member includes a first opening configured to receive a first lifting device support element, and the second support receiving member includes a second opening configured to receive a second lifting device support element.

Such an arrangement advantageously provides a mechanism to support and stabilize loaded and empty equipment racks during transport to different elevations. Illustrative embodiments provide a system and techniques that allow for the vertical transition of electronic equipment racks to and from structures at different heights, where a transition ramp from one level to another level is prohibited or not practical. As an additional advantage, the embodiments enable safe transport via a lifting device of equipment racks of different sizes to and from various elevations.

These and other embodiments include, without limitation, apparatus, systems and methods.

BRIEF DESCRIPTION OF THE DRAWINGS

FIG. 2A depicts an image of an elevated module including an equipment rack attached to a floor plate and an adapter plate attached to the elevated module in an illustrative embodiment.

FIG. 2B depicts an enlarged image of the circled portion of FIG. 2A in an illustrative embodiment.

DETAILED DESCRIPTION

Illustrative embodiments will be described herein with reference to exemplary rack lift cages and component configurations for transporting electronic equipment racks. It is to be appreciated, however, that the embodiments are not restricted to the particular illustrative configurations shown. Terms such as "electronic equipment racks" as used herein are intended to be broadly construed, so as to encompass, for example, a wide variety of arrangements of housings for electronic equipment, such as, but not necessarily limited to, chassis and frames, which may be used to house different arrangements of storage drives, processors, servers or other types of computer components and electronic equipment.

Figure 1:
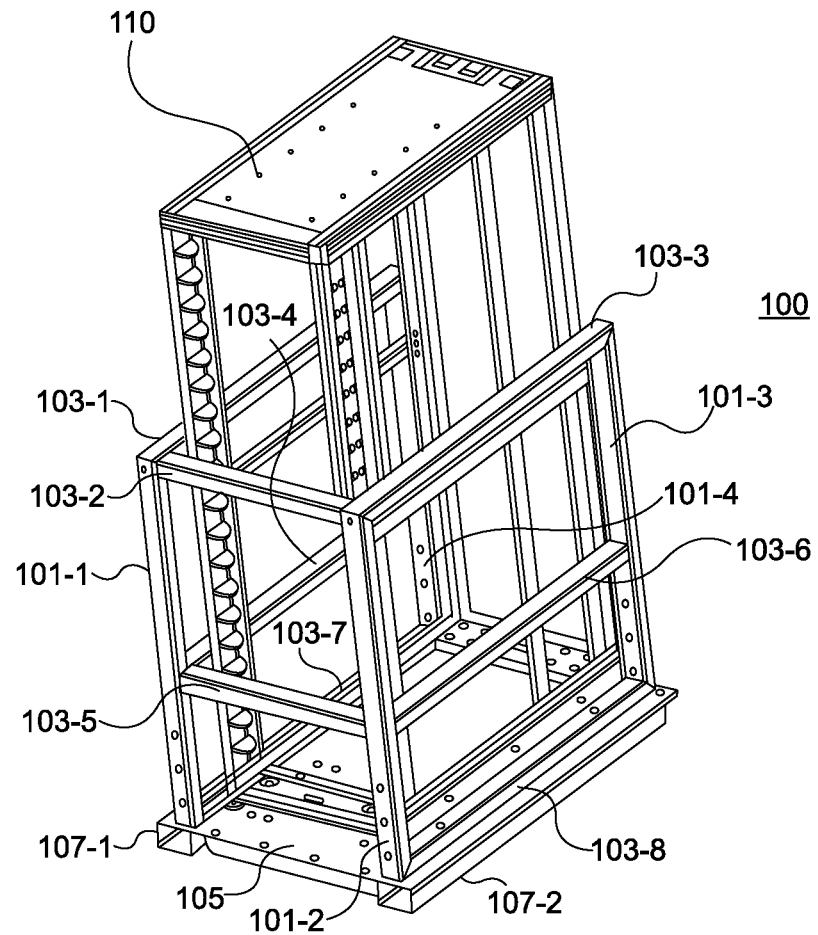
FIG. 1 depicts a schematic perspective view of a rack lift cage in an illustrative embodiment.

Referring to FIG. 1, a rack lift cage 100 comprises a platform 105. A first side of a frame on the platform 105 (left side in FIG. 1) comprises vertical elements 101-1 and 101-4, and horizontal elements 103-1, 103-4 and 103-7. A second side of a frame on the platform 105 (right side in FIG. 1) disposed opposite the first side comprises vertical elements 101-2 and 101-3, and horizontal elements 103-3, 103-6 and 103-8. A third side of a frame on the platform 105 disposed between the first and second sides comprises horizontal elements 103-2 and 103-5 between the vertical elements 101-1 and 101-2.

Support receiving members 107-1 and 107-2 are disposed under the platform 105. The support receiving members 107-1 and 107-2 each include an opening configured to receive respective lifting device support elements. For example, according to an embodiment, as described in more detail in connection with FIGS. 7 and 8, the support receiving members 107-1 and 107-2 are sized and spaced apart from each other so that respective forks 167 of a forklift 160 can be inserted into the openings of support receiving members 107-1 and 107-2 to support the platform 105. Forklift forks, also known as tines or blades, are used to lift and carry loads.

As shown in FIG. 1, the rack lift cage 100 accommodates an electronic equipment rack 110 disposed on the platform 105. As noted herein above, an electronic equipment rack 110 is be broadly construed, so as to encompass, for example, a wide variety of arrangements of housings for electronic equipment. The electronic equipment rack 110 may be empty or loaded with electronic equipment.

Figure 3:
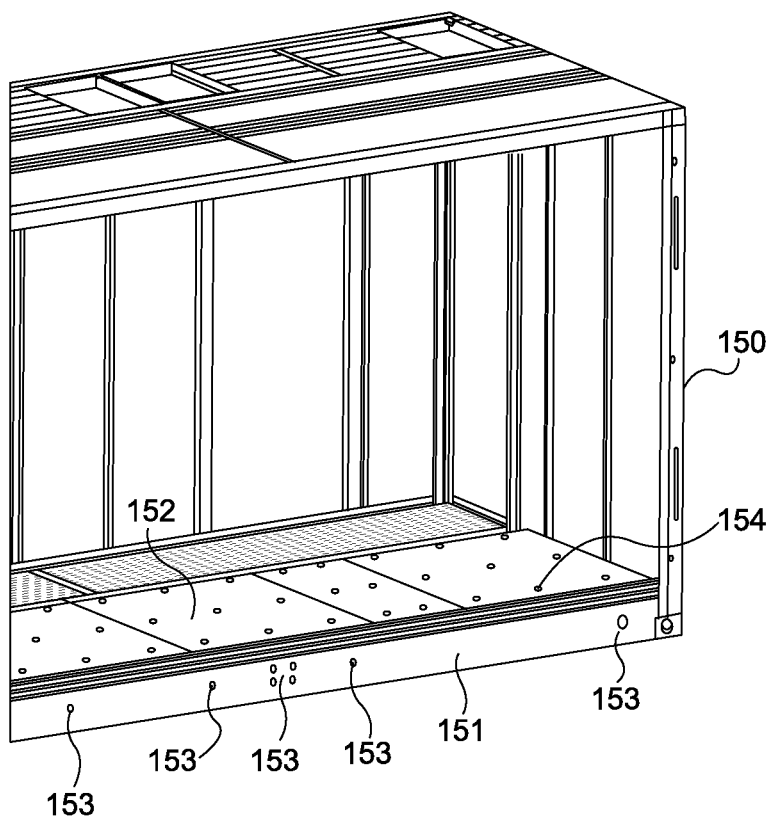
FIG. 3 depicts a schematic perspective view of the elevated module of FIG. 2A in an illustrative embodiment.

As noted herein above, electronic equipment racks need to be lifted onto elevated floors for placement in a modular datacenter or removed therefrom. The equipment racks may also need to be loaded and unloaded to and from elevated transport vehicles, such as trucks or trains. Referring to FIGS. 2A and 2B, an elevated modular datacenter 150 includes an electronic equipment rack 110 therein. Reference is also made to FIG. 3, which depicts a schematic perspective view of the elevated modular datacenter 150 of FIG. 2A without the electronic equipment rack 110 therein. FIG. 3 illustrates a front surface 151 and a floor 152 of the modular datacenter 150 with holes 153 in the front surface 151 and holes 154 in the floor 152. In other embodiments, the elevated structure may be, for example, the inside of a truck or train. The modular datacenter 150 is FIGS. 2A and 2B is disposed on a flatbed of a truck trailer, which may be used to transport the modular datacenter 150.

The electronic equipment rack 110 is secured in place to a floor 152 of the modular datacenter 150 by a floor plate 120. The floor plate 120 comprises a base portion 121 and a vertical extension portion 122 extending vertically (e.g., perpendicularly) from an edge of the base portion 121. As shown in FIG. 2B, the vertical extension portion 122 of the floor plate 120 is formed in a stepped configuration, where a central portion of a top surface of the vertical extension portion 122 steps up to a greater height above the base portion 121 than portions of the top surface on either side of the central portion. The vertical extension portion 122 and the base portion 121 each include a plurality of holes through the vertical extension portion 122 and the base portion 121 for receiving fasteners 123. In order to secure the floor plate 120 to the electronic equipment rack 110, some of the fasteners 123 are inserted through the holes in the vertical extension portion 122 into holes in the front surface of the electronic equipment rack 110. In order to secure the floor plate 120 to the floor 152, some of the fasteners 123 are inserted through the holes in the vertical extension portion 122 into holes 154 (see FIG. 3) in the floor 152 of the modular datacenter 150. The number of holes in the floor plate 120, electronic equipment rack 110 and the floor 152 are not limited to what is shown in FIGS. 2A, 2B and 3, and there may be more or less holes. The holes may be threaded or not threaded. The fasteners 123 may include, for example, drop pins, screws, bolts, nuts, washers and/or lock washers.

An adapter plate 130 is also shown in FIGS. 2A and 2B. The adapter plate 130 comprises a base portion 132 oriented perpendicular to an extension portion 131. The extension portion 131 extends perpendicularly from an edge of the base portion 132. As shown in FIG. 2B, the extension portion 131 of the adapter plate 130 is formed in a stepped configuration, where a central portion 131b of the extension portion 131 steps outward to extend to a greater distance from the base portion 132 than portions 131a on either side of the central portion 131b. The central portion 131b is supported by a plurality of gussets 135 extending from the base portion 132 to the bottom surface of the central portion 131b. A side of each of the gussets 135 extends between the base portion 132 and the central portion 131b of the extension portion 131 at acute angles with respect to the base portion 132 and the central portion 131b. In one or more embodiments, the gussets 135 are in the shape of a right triangle where the side that extends between the central portion 131b and the base portion 132 is a hypotenuse of the right triangle. The shape, number and location of the gussets 135 may vary according to manufacturing tolerances. The adapter plate 130 further includes a plurality of side panels 137 extending from left and right side edges of the base portion 132 and attached to the portions 131a for added support of the extension portion 131. In an alternative embodiment, the extension portion 131 comprises a uniform width and is not in a stepped configuration.

Figure 5A:
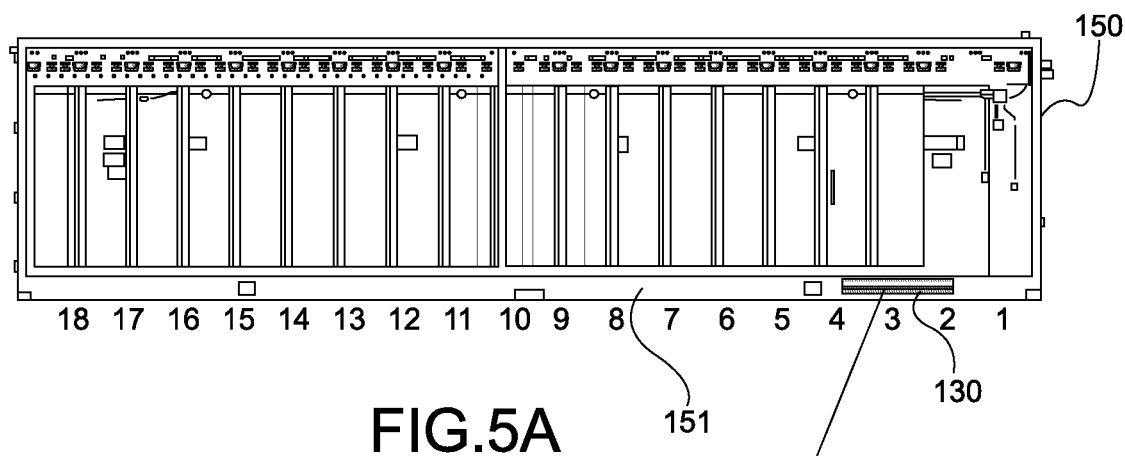
FIG. 5A depicts a schematic front view of an elevated module including an adapter plate attached to the elevated module in an illustrative embodiment.
Figure 5B:
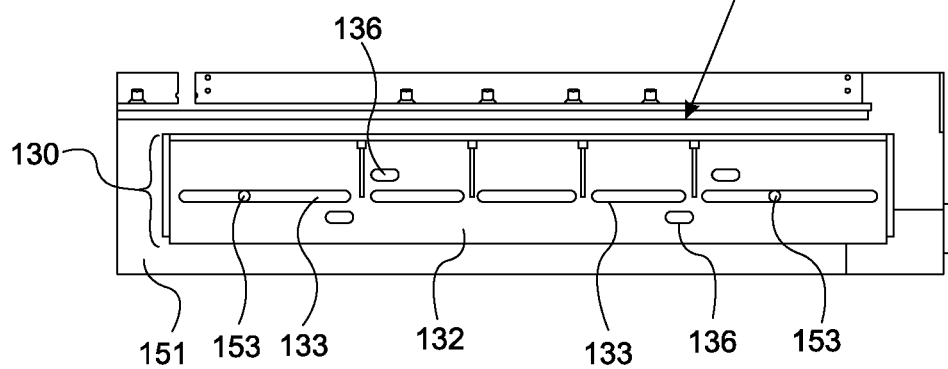
FIG. 5B depicts an enlarged schematic front view of the portion of FIG. 5A including the adapter plate in an illustrative embodiment.

The base portion 132 comprises a plurality of grooves 133 and a plurality of holes 136 through the base portion 132. The grooves 133 and holes 136 are in different locations in the base portion 132 to correspond to holes 153 in different locations on the front surface 151 of the modular datacenter 150. Fasteners 134 inserted through the grooves 133 and/or the holes 136 into the front surface 151 of the modular datacenter 150 are used to affix the adapter plate 130 to the modular datacenter 150. The sizes and different locations of the grooves 133 and holes 136 permit the grooves 133 and/or holes 136 to align with the differently located holes 153 in the front surface 151 of the modular datacenter 150 so that a location of the adapter plate 130 can be varied along a length of the modular datacenter 150. The location of the adapter plate 130 may need to be varied depending on the placement of an electronic equipment rack 110 in the modular datacenter 150. For example, referring to FIGS. 5A and 5B, electronic equipment racks 110 may correspond to a plurality of locations 1-18 along a length of a modular datacenter 150. As explained in more detail herein below, the adapter plate 130 provides support for a platform 105 of a rack lift cage 100 during transport of an electronic equipment rack 110. The adapter plate 130 is configured to be mountable to the front surface 151 of the modular datacenter 150 at the different locations 1-18 so that when an electronic equipment rack 110 corresponding to a given location is to be moved into or out of the modular datacenter 150, the adapter plate 130 can be positioned at the given location to provide the needed support for the platform 105 during loading or unloading of the electronic equipment rack 110.

Figure 4:
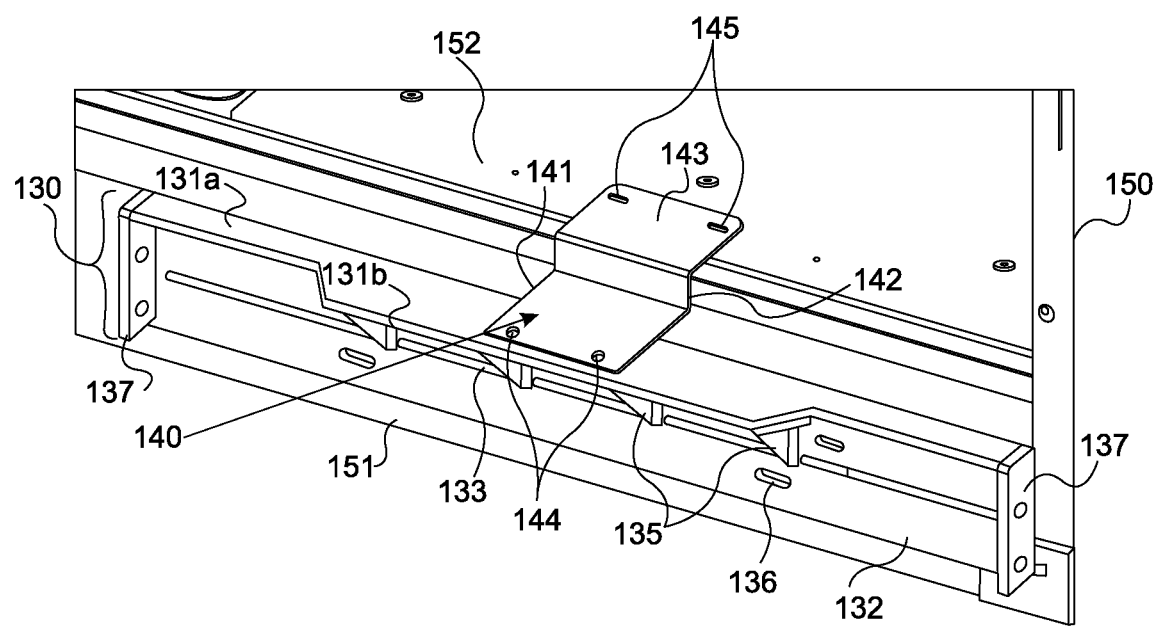
FIG. 4 depicts a schematic perspective view of a positioning bracket in a position to align an adapter plate on an elevated module in an illustrative embodiment.

Referring to FIG. 4, a z-shaped positioning bracket 140 can be used to accurately position an adapter plate 130 on the modular datacenter 150. The positioning bracket 140 includes a first horizontal portion 141, second horizontal portion 143 and a vertical portion 142 between the first and second horizontal portions 141 and 143. In an embodiment, the first horizontal portion 141 of the positioning bracket 140 includes holes 144 therein which align with holes (not shown) in the central portion 131b of the adapter plate 130. Fasteners are inserted through the holes 144 into the holes in the central portion 131b to affix the positioning bracket 140 to the adapter plate 130. The second horizontal portion 143 of the positioning bracket 140 includes holes 145 therein which align with holes 154 in the floor 152 of the modular datacenter 150. Fasteners are inserted through the holes 145 into the holes 154 in the floor 152 to affix the positioning bracket 140 to the floor 152 of the modular datacenter 150 at the desired position. Then, with the positioning bracket in place, the adapter plate 130 can be attached to the front surface 151 of the modular datacenter 150 using the fasteners 134 and grooves 133 and/or holes 136. After fixing the adapter plate 130 to the modular datacenter 150, the positioning bracket 140 can be removed.

Figure 6:
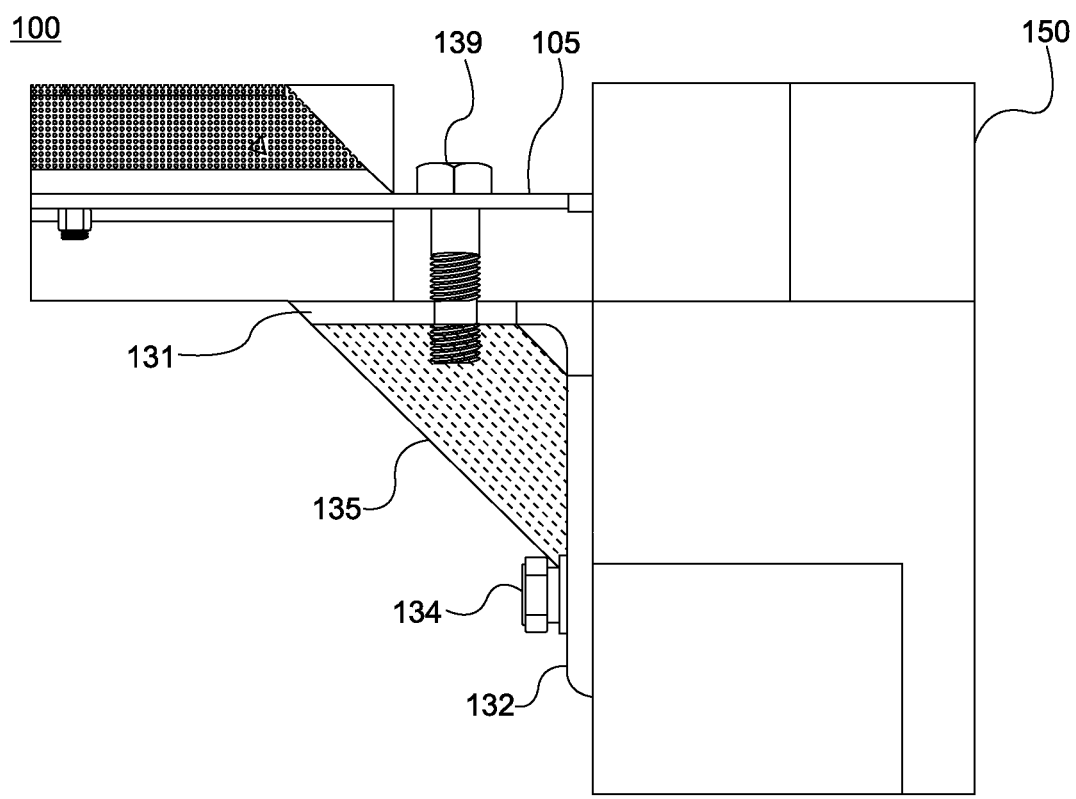
FIG. 6 depicts a side view of a platform of a rack lift cage secured to an adapter plate attached to an elevated module in an illustrative embodiment.

As noted herein above, extension portion 131 of the adapter plate 130 is configured to support an end portion of the platform 105 disposed on the extension portion 131. For example, referring to FIG. 6, an adapter plate 130 is affixed to a front surface 151 of a modular datacenter 150 via at least one fastener 134 inserted through a hole 136 or groove 133 in the base portion 132. A gusset 135 supports the extension portion 131. As shown in FIG. 6, an end portion of a platform 105 of a rack lift cage 100 rests on the extension portion 131. The extension portion 131 comprises a hole through the extension portion 131, and the end portion of the platform 105 comprises a hole through the end portion. The end portion of the platform 105 is attached to the extension portion 131 via a fastener 139 inserted through the holes in the extension portion 131 and the end portion of the platform 105. In one or more embodiments, depending on the configuration of the platform 105 and/or the adapter plate 130, the end portion of platform 105 rests on portions 131a and central portion 131b of the extension portion 131, or on the central portion 131b and not on portion 131a. Fasteners like the fastener 139 can be inserted through holes in the portions 131a and/or central portion 131b and corresponding holes in the end portion of the platform 105 to attach the platform 105 to the extension portion 131. Securing the platform 105 to the adapter plate 130 prevents the platform from springing upward when an electronic equipment rack 110 is rolled off of the platform 105 into a modular datacenter 150.

Figure 7:
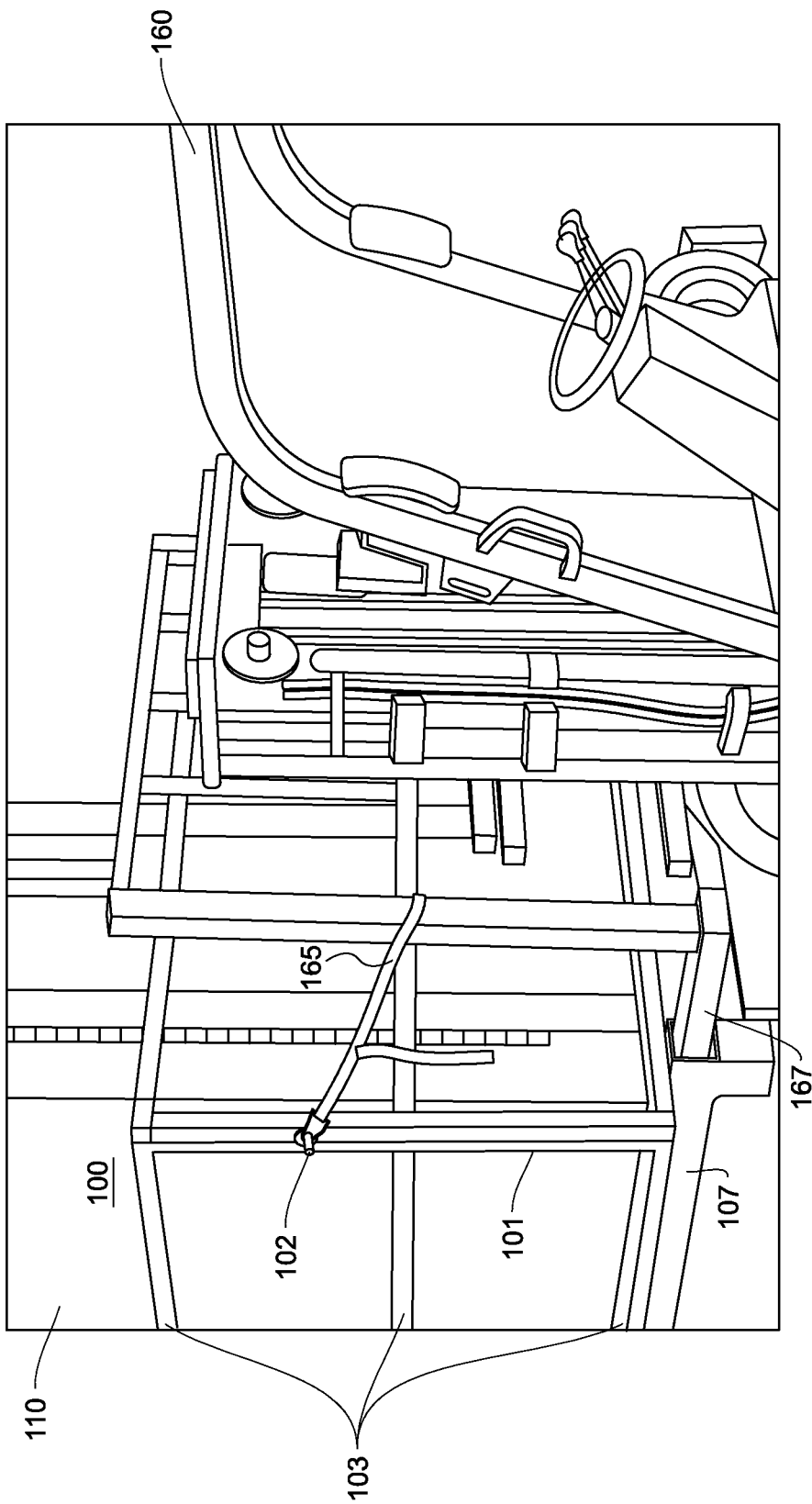
FIG. 7 depicts an image of a rack lift cage attached to a forklift and including an equipment rack therein in an illustrative embodiment.

Referring to FIG. 7, a rack lift cage 100 including an electronic equipment rack 110 therein is engaged by the forks 167 of a forklift 160. The forks 167 of the forklift 160 are inserted into openings in receiving members 107 positioned under a platform of the rack lift cage 100. As shown in FIG. 7, a safety strap attachment point 102 is located on a vertical element 101 of a frame of the rack lift cage 100. A safety strap 165 extends between the forklift 160 and the safety strap attachment point 102 to further stabilize the rack lift cage 100. The safety strap attachment point 102 may comprise a fastener protruding from the vertical element 101. The rack lift cage 100 shown in FIG. 7 includes horizontal elements 103 as part of its frame. The forklift 160 is used to transfer the rack lift cage 100 and the electronic equipment rack 110 between different heights, such as, for example, from or to ground level and from or to a height of an elevated structure (e.g., modular datacenter 150 or a transport vehicle) above ground level.

Figure 8:
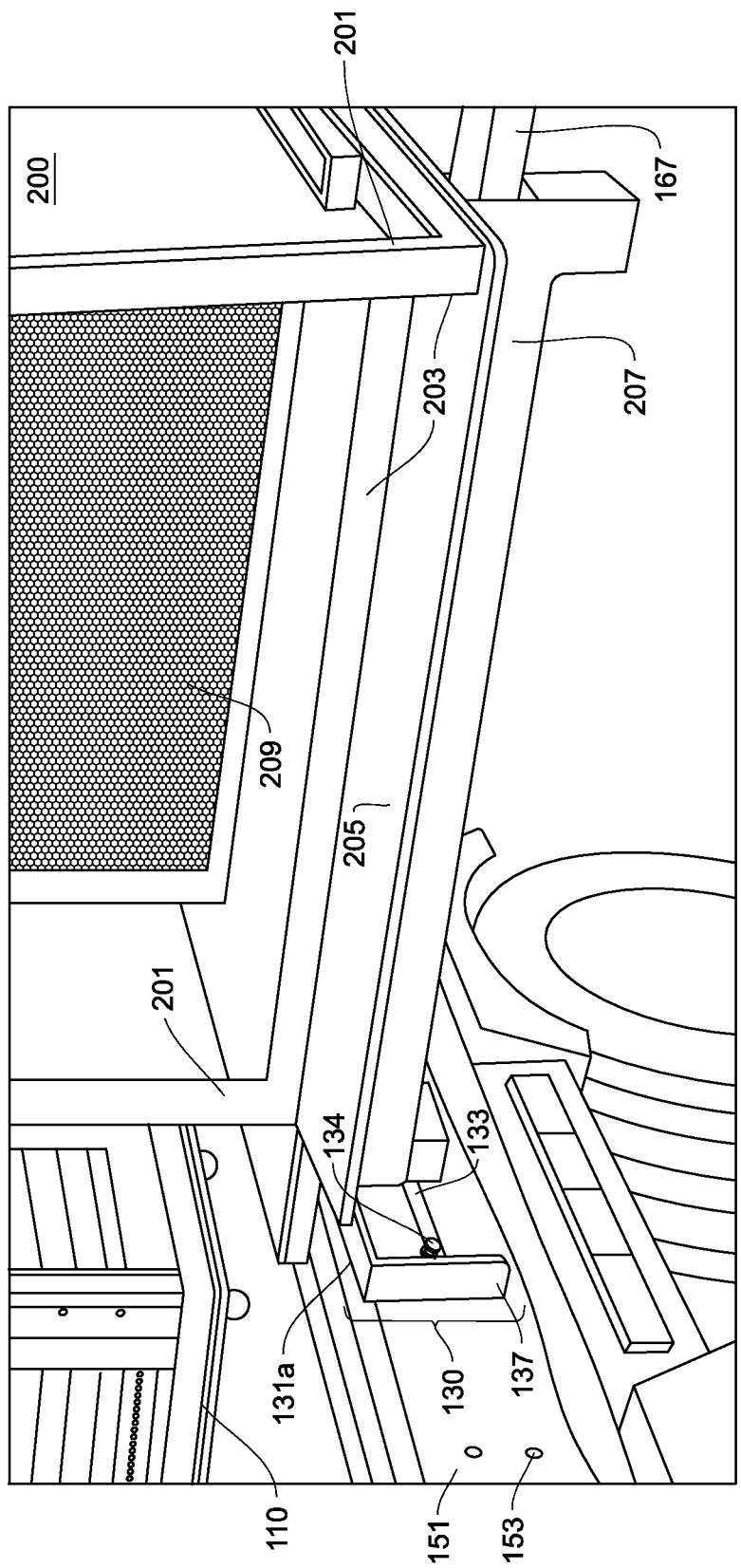
FIG. 8 depicts an image of a platform of a rack lift cage resting on an adapter plate attached to an elevated module in an illustrative embodiment.

Referring to FIG. 8, a rack lift cage 200 having a similar configuration to the rack lift cage 100 includes vertical frame elements 201, horizontal frame elements 203, a platform 205 and lifting device support element receiving members 207. As shown in FIG. 8, the lifting device support element receiving members 207 are located under the platform 205 and are engaged by the forks 167 of a forklift. With the forks 167 in the elevated position, an end portion of the platform 205 is disposed on the portion 131a of the extension portion 131 of an adapter plate 130. Although not visible in FIG. 8, the end portion of the platform 205 is also disposed on the central portion 131b of the adapter plate 130. A groove 133, fastener 134 and a side panel 137 of the adapter plate 130 are also visible in FIG. 8. The adapter plate 130 is attached to a front surface 151 of an elevated modular datacenter 150. Holes 153 are shown in the front surface 151. In the embodiment in FIG. 8, left and right sides of the frame of the rack lift cage 200 are moveable. As can be seen in FIG. 8, the left and right sides have been adjusted inward toward each other to reduce a distance between the left and right sides of the frame and conform to a width of the electronic equipment rack 110 being loaded onto the transport structure comprising the rack lift cage 200. Reducing the distance between the sides of the frame ensures a tighter fit for the electronic equipment rack 110 on the transport structure, which limits the range of motion of electronic equipment rack 110, thereby further stabilizing the electronic equipment rack 110. A mesh side panel 209 affixed to a side of the frame is also shown in FIG. 8.

Figure 9:
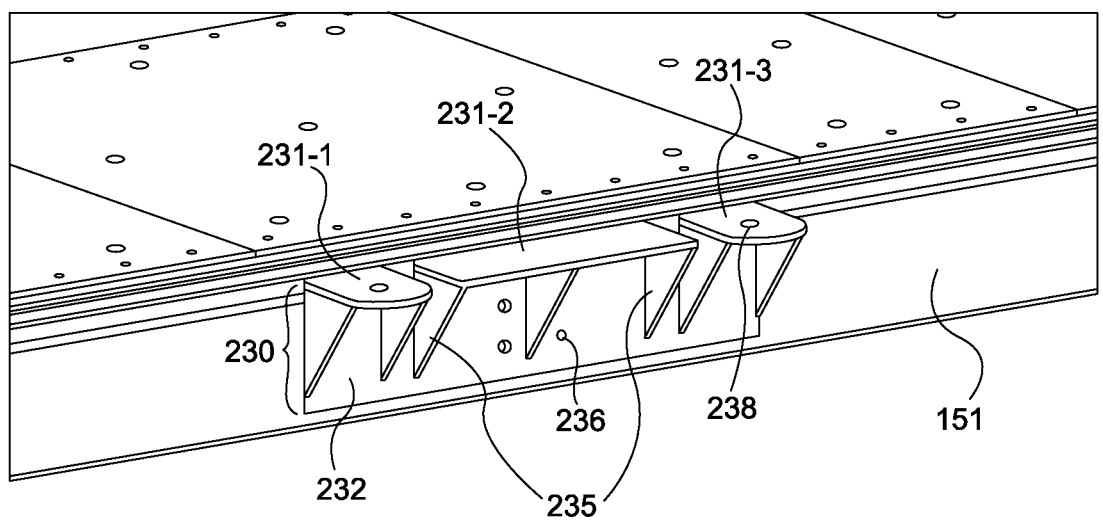
FIG. 9 depicts a schematic perspective view of an adapter plate on an elevated module in an illustrative embodiment.

FIG. 9 illustrates another embodiment of an adapter plate 230. The adapter plate 230 includes a base portion 232 and a plurality of extension portions 231-1, 231-2 and 231-3 (collectively "extension portions 231"), which are spaced apart from each other. Each of the extension portions 231 are supported by gussets 235 similar to the gussets 135. The extension portions 231 have substantially uniform distances from the edge of the base portion 232 from which they extend. Similar to the adapter plate 130, the base portion 232 includes holes 236 through which fasteners can be inserted into holes in a surface of the modular datacenter 150 or other elevated structure to attach the adapter plate 230 to the modular datacenter 150 or other elevated structure. Also similar to the adapter plate 130, an end portion of a platform of a rack lift cage rests on and is supported by the extension portions 231 during transfer of an equipment rack between the elevated structure and the rack lift cage. Any of the extension portions 231 may include holes (e.g., illustrated holes 238 in extension portions 231-1 and 231-3) aligned with holes in the end portion of a platform of a rack lift cage, and which can receive fasteners to attach the end portion of the platform to one or more of the extension portions 231.

Figure 10A:
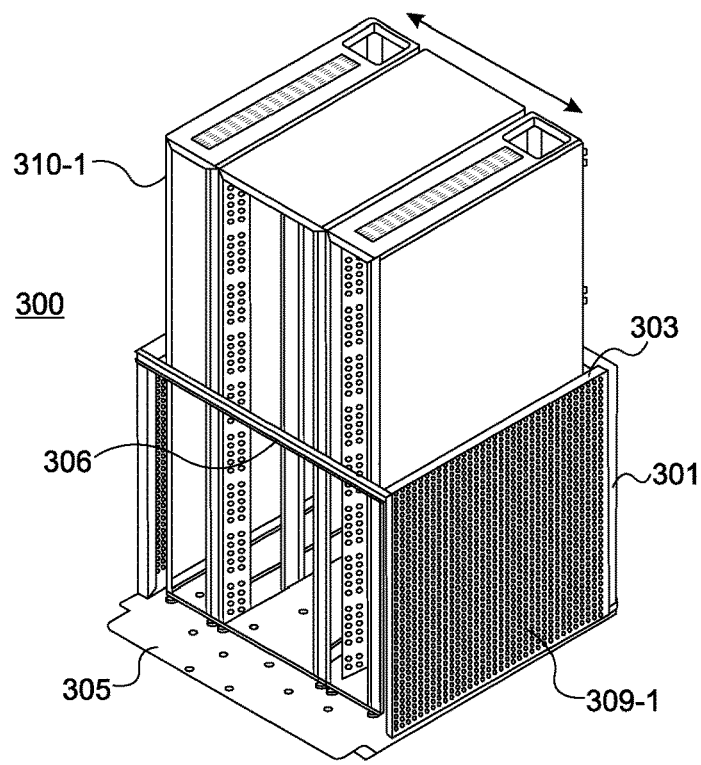
FIGS. 10A and 10B depict schematic perspective views of a rack lift cage including movable side panels to accommodate different sized equipment racks in an illustrative embodiment.
Figure 10B:
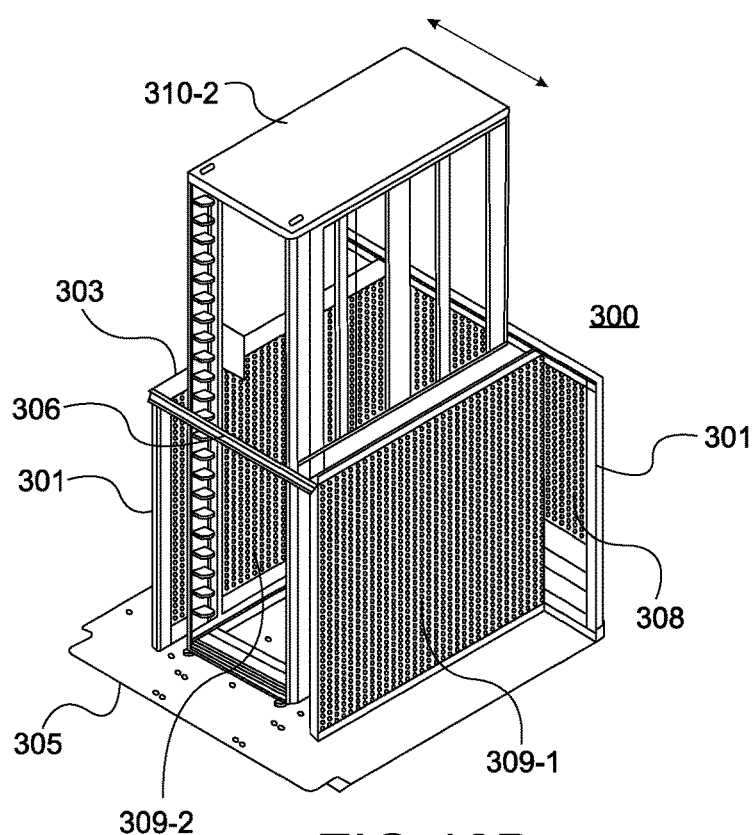

Referring to FIGS. 10A and 10B, according to an embodiment, a rack lift cage 300 comprises a frame on a platform 305. The frame comprises a first side 309-1, a second side 309-2 and a third side 308 extending perpendicularly from the platform 305 and configured in a U-shape. The sides 309-1, 309-2 and 308 include vertical and horizontal elements 301 and 303, and a wall (e.g., illustrated as a mesh wall) between the vertical and horizontal elements 301 and 303.

The first side 309-1 is positioned opposite the second side 309-2, and the third side 308 is positioned between the first and second sides 309-1 and 309-2. The first and second sides are 309-1 and 309-2 are moveable along a width of the third side 308 to change a distance between the first and second sides 309-1 and 309-2. For example, the first and second sides 309-1 and 309-2 are configured to be selectively attached to and detached from the platform 305 via one or more removable fasteners inserted through holes in horizontal elements 303 of the first and second sides 309-1 and 309-2 disposed on the platform 305. Additionally, or alternatively, the first and second sides 309-1 and 309-2 slide along tracks in the platform 305 and/or on the third side 308.

As can be seen by the arrows in FIGS. 10A and 10B, the distance between the first and second sides 309-1 and 309-2 is modified to conform to sizes of a wider electronic equipment rack 310-1 and a narrower electronic equipment rack 310-2. A crossbar 306, which can vary in length is attached between the first and second sides 309-1 and 309-2 to enclose the electronic equipment racks 310-1 and 310-2 in the rack lift cage 300.

Figure 11A:
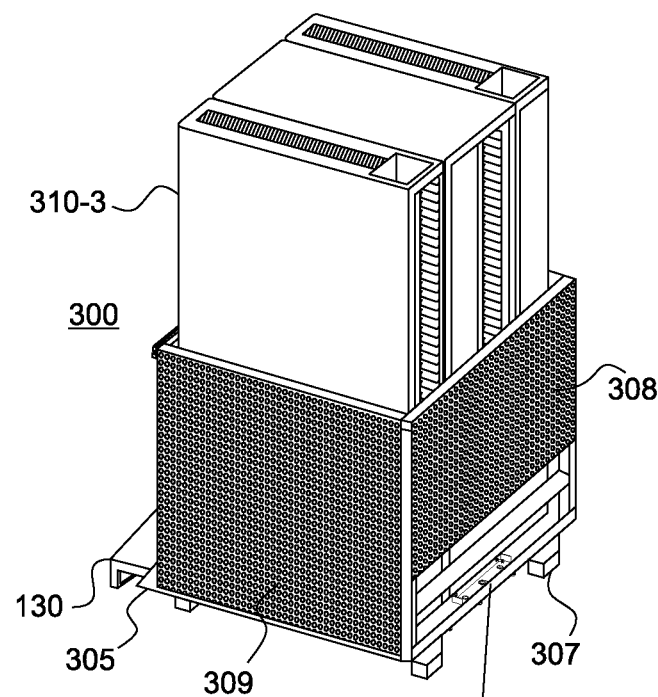
FIG. 11A depicts a schematic perspective view of a rack lift cage and an equipment rack secured to a platform of the rack lift cage with a bracket in an illustrative embodiment.
Figure 11B:
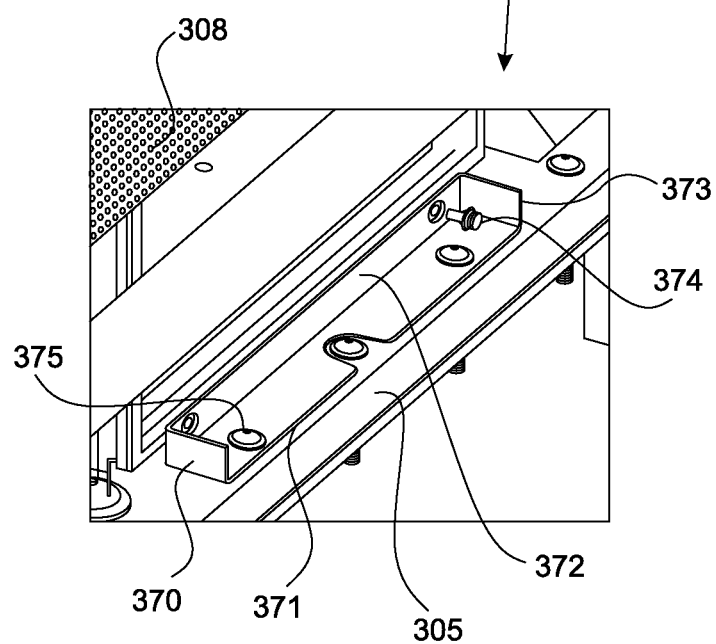
FIG. 11B depicts an enlarged schematic perspective view of the portion of FIG. 11A showing the equipment rack secured with the bracket in an illustrative embodiment.

Referring to FIGS. 11A and 11B, a stabilizing bracket 370 is configured for attachment to the platform 305 of a rack lift cage 300 and to a surface of an electronic equipment rack 310-3 or other object positioned on the platform 305. The bracket 370 comprises a base 371 comprising one or more holes through the base 371, each configured to receive a fastener 375. The bracket 370 further comprises an extension portion 372 extending from the base 371. The extension portion 372 is perpendicular to the base 371 and comprises one or more holes through the extension portion 372, each configured to receive a fastener 374. In order to attach the bracket 370 to the platform 305, the fasteners 375 are inserted through respective ones of the holes in the base 371 into corresponding holes in the platform 305. In order to attach the bracket 370 to the electronic equipment rack 310-3, the fasteners 374 are inserted through respective ones of the holes in the extension portion 372 into corresponding holes in the electronic equipment rack 310-3. The bracket 370 further includes side panels 373 extending perpendicularly from the base 371 and from the extension portion 372. FIG. 11A further illustrates lifting device support receiving members 307 disposed under the platform 305.

Figure 12B:
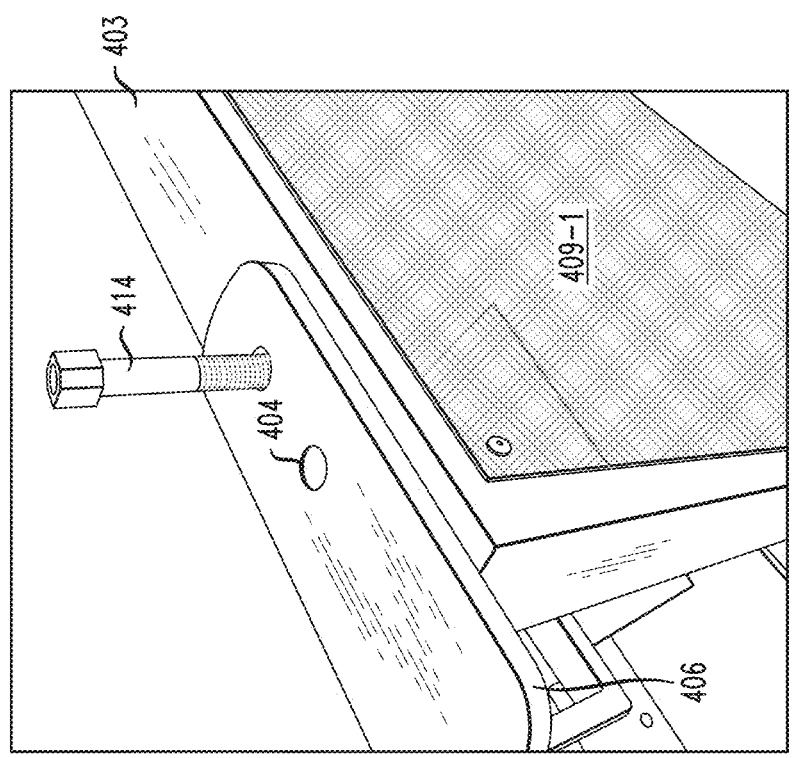
FIGS. 12A and 12B depict images of a removable crossbar for a rack lift cage in an illustrative embodiment.
Figure 12A:
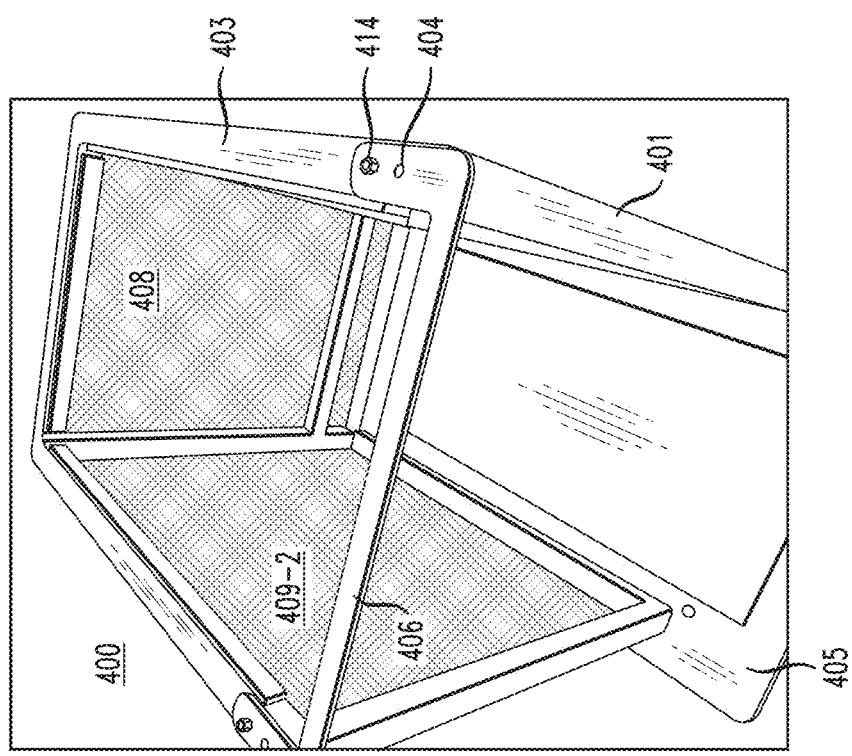

Referring to FIGS. 12A and 12B, according to an embodiment, a rack lift cage 400 comprises a frame on a platform 405. The frame comprises a first side 409-1, a second side 409-2 and a third side 408 extending perpendicularly from the platform 405 and configured in a U-shape. The sides 409-1, 409-2 and 408 include vertical and horizontal elements 401 and 403, and a wall (e.g., illustrated as a mesh wall) between the vertical and horizontal elements 401 and 403.

The first side 409-1 is positioned opposite the second side 409-2, and the third side 408 is positioned between the first and second sides 409-1 and 409-2. A crossbar 406 is configured for attachment to the first and second sides 409-1 and 409-2 of the frame. The crossbar 406 is positioned opposite the third side 408 of the frame. In the embodiment in FIG. 4, the crossbar 406 comprises a U-shape and includes openings 404 to align with openings in the top horizontal elements 403 of the first and second sides 409-1 and 409-2. A fastener 414 is inserted into each of the openings 404 and the corresponding openings in the top horizontal elements 403 to lock the crossbar 406 in place. The crossbar 406 encloses an equipment rack in the rack lift cage 400.

The materials of the vertical elements 101/201/301/401, horizontal elements 103/203/303/403, platforms 105/205/305/405 and support receiving members 107/207/307 of the rack lift cages 100/200/300/400 include, but are not necessarily limited to, stainless steel, aluminum, copper, bronze, brass, galvanized steel or alloys thereof (e.g., 304 and 304L ASTM A240 stainless steel plate, ASTM A551 carbon steel). The number of holes and fasteners described herein may vary. In addition, the holes described herein may be threaded or not threaded. The fasteners described herein may include, for example, drop pins, screws, bolts, nuts, washers and/or lock washers.

The embodiments advantageously provide for fast integration of information technology (IT) and other types of electronic equipment racks into modular datacenters. For example, modular datacenters may be left on elevated truck trailers at an integration facility, where equipment racks can be loaded and unloaded to and from the modular datacenters. The embodiments provide a safe mechanism for transporting equipment to different heights, and are flexible with respect to the size and type of equipment racks that can be moved.

Advantageously, the transport structures of the embodiments are configured to be re-used and re-purposed as needed to achieve the removal and installation of electronic equipment racks. Adapter plates provide level and continuous surfaces over which equipment racks can be moved when being transported between rack lift cages and modular datacenters. The embodiments further provide multiple techniques and apparatuses to secure and stabilize equipment racks during loading and unloading processes.

The arrangements shown in the illustrative embodiments of FIGS. 1 through 12B are presented by way of example for purposes of illustration only, and alternative embodiments can utilize a wide variety of other types of rack lift cages, adapter plates, elevated structures (e.g., modular datacenters, transport vehicles), brackets and lifting devices. Accordingly, the particular configurations of components as shown in the figures can be varied in other embodiments. Moreover, the various assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. A transport support structure comprising:
a platform;
a first frame side on the platform;
a second frame side on the platform, wherein the second frame side is disposed opposite and spaced apart from the first frame side;
a third frame side on the platform and extending between the first and second frame sides;
a first support receiving member disposed under the platform, wherein the first support receiving member includes a first opening configured to receive a first lifting device support element;
a second support receiving member disposed under the platform, wherein the second support receiving member includes a second opening configured to receive a second lifting device support element; and
an adapter plate configured for attachment to a surface of an elevated structure, the adapter plate comprising an extension portion configured to support an end portion of the platform disposed on the extension portion;
wherein the extension portion comprises at least a first hole through the extension portion, the end portion of the platform comprises at least a second hole through the end portion, and the end portion is attached to the extension portion via a fastener inserted through the first and second holes.

2. The transport support structure of claim 1 wherein the first lifting device support element comprises a first fork of a forklift, and the second lifting device support element comprises a second fork of the forklift.

3. The transport support structure of claim 1 wherein the first and second frame sides are moveable along a width of the third frame side to change a distance between the first and second frame sides.

4. The transport support structure of claim 1 wherein the adapter plate further comprises a base portion oriented perpendicular to the extension portion and comprising at least one opening through the base portion configured to receive a second fastener, and wherein the adapter plate is configured for attachment to the surface of the elevated structure via the second fastener inserted through the opening.

5. The transport support structure of claim 1 further comprising a crossbar configured for attachment to the first and second frame sides, wherein the crossbar is positioned opposite the third frame side.

6. A transport support structure comprising:
a platform;
a first frame side on the platform;
a second frame side on the platform, wherein the second frame side is disposed opposite and spaced apart from the first frame side;
a third frame side on the platform and extending between the first and second frame sides;
a first support receiving member disposed under the platform, wherein the first support receiving member includes a first opening configured to receive a first lifting device support element;
a second support receiving member disposed under the platform, wherein the second support receiving member includes a second opening configured to receive a second lifting device support element; and
a bracket configured for attachment to the platform and to a surface of an object positioned on the platform, wherein the bracket comprises:
a base comprising at least a first hole through the base, wherein the first hole is configured to receive a first fastener; and
an extension portion extending from the base, wherein the extension portion is perpendicular to the base and comprises at least a second hole through the extension portion, wherein the second hole is configured to receive a second fastener.

7. The transport support structure of claim 6 wherein the bracket is configured for attachment to the platform via the first fastener inserted through the first hole into a hole in the platform, and wherein the bracket is configured for attachment to the surface of the object via the second fastener inserted through the second hole into a hole in the surface of the object.

8. The transport support structure of claim 7 wherein the object comprises an electronic equipment rack.

9. A method comprising:
engaging a transport support structure with a lifting device;
lifting the transport support structure from a first height to a second height corresponding to an elevated structure;
loading an electronic equipment rack from the elevated structure onto the transport support structure; and
lowering the transport support structure from the second height to the first height;
wherein the lifting device comprises a first support element and a second support element extending from the lifting device;
wherein the transport support structure comprises:
a platform;
a frame on the platform, wherein the frame comprises a first side, a second side and a third side extending perpendicularly from the platform and configured in a U-shape;
a first receiving member attached to the platform and comprising a first opening; and
a second receiving member attached to the platform and comprising a second opening;
wherein engaging the transport support structure with the lifting device comprises respectively inserting the first and second support elements into the first and second openings; and
wherein the method further comprises:
attaching an adapter plate to a surface of the elevated structure, wherein the adapter plate comprises a first extension portion;
disposing an end portion of the platform on the first extension portion, wherein the first extension portion comprises at least a first hole through the first extension portion, and the end portion of the platform comprises at least a second hole through the end portion; and
attaching the end portion to the first extension portion via a fastener inserted through the first and second holes.

10. The method of claim 9 wherein the lifting device comprises a forklift and the first and second support elements respectively comprise first and second forks of the forklift.

11. The method of claim 9 wherein the first and second sides are positioned opposite each other and the method further comprises moving the first and second sides along a width of the third side to change a distance between the first and second sides.

12. The method of claim 9 further comprising attaching a bracket to the platform and to a surface of the electronic equipment rack positioned on the platform, wherein the bracket comprises:
a base comprising at least a first hole through the base, wherein the first hole through the base is configured to receive a first fastener; and
a second extension portion extending from the base, wherein the second extension portion is perpendicular to the base and comprises at least a second hole through the second extension portion, wherein the second hole through the second extension portion is configured to receive a second fastener.

13. The method of claim 12 wherein attaching the bracket to the platform and to a surface of the electronic equipment rack comprises:
inserting the first fastener through the first hole into a hole in the platform; and
inserting the second fastener through the second hole into a hole in the surface of the electronic equipment rack.

14. An electronic equipment transport system comprising:
a support structure engaged with a lifting device; and
an adapter plate attached to a surface of an elevated structure;
wherein the lifting device comprises forklift comprising a first fork and a second fork extending from the forklift;
wherein the support structure comprises:
a platform;
a first receiving member attached to the platform and comprising a first opening in which the first fork is inserted; and
a second receiving member attached to the platform and comprising a second opening in which the second fork is inserted;
wherein the adapter plate comprises an extension portion extending perpendicular from the surface of the elevated structure and configured to support an end portion of the platform disposed on the extension portion, wherein the extension portion comprises at least a first hole through the extension portion, the end portion of the platform comprises at least a second hole through the end portion, and the end portion is attached to the extension portion via a fastener inserted through the first and second holes; and
wherein the end portion of the platform is configured to be disposed on the extension portion when the platform is elevated to a height above the extension portion.

15. The electronic equipment transport system of claim 14 wherein the support structure further comprises a frame on the platform, the frame comprising a first side, a second side and a third side extending perpendicularly from the platform, and wherein the first side is positioned opposite the second side, and the third side is positioned between the first and second sides.

16. The electronic equipment transport system of claim 15 wherein the first and second sides are moveable along a width of the third side to change a distance between the first and second sides.

17. The electronic equipment transport system of claim 14 wherein the adapter plate further comprises a base portion oriented perpendicular to the extension portion and comprising at least one opening through the base portion configured to receive a second fastener, and wherein the adapter plate is configured for attachment to the surface of the elevated structure via the second fastener inserted through the opening.

18. The electronic equipment transport system of claim 14 further comprising a bracket configured for attachment to the platform and to a surface of an object positioned on the platform, wherein the bracket comprises:

a base comprising at least a first hole through the base, wherein the first hole is configured to receive a first fastener; and an additional extension portion extending from the base, wherein the additional extension portion is perpendicular to the base and comprises at least a second hole through the additional extension portion, wherein the second hole is configured to receive a second fastener.

19. The electronic equipment transport system of claim 18 wherein the bracket is configured for attachment to the platform via the first fastener inserted through the first hole into a hole in the platform, and wherein the bracket is configured for attachment to the surface of the object via the second fastener inserted through the second hole into a hole in the surface of the object.

20. The electronic equipment transport system of claim 18 wherein the object comprises an electronic equipment rack.

* * * * *